United States Patent
Benaim et al.

(10) Patent No.: US 9,753,453 B2
(45) Date of Patent: Sep. 5, 2017

(54) NATURAL MACHINE INTERFACE SYSTEM

(71) Applicant: Deep Learning Robotics Ltd., Ashdod (IL)

(72) Inventors: Carlos Benaim, Binyamina (IL); Miriam Reiner, Haifa (IL)

(73) Assignee: Deep Learning Robotics Ltd., Ashdod (IL)

( * ) Notice: Subject to any disclaimer, the term of this patent is extended or adjusted under 35 U.S.C. 154(b) by 117 days.

(21) Appl. No.: 13/937,397

(22) Filed: Jul. 9, 2013

(65) Prior Publication Data

US 2014/0012415 A1    Jan. 9, 2014

Related U.S. Application Data

(60) Provisional application No. 61/699,144, filed on Jul. 9, 2012, provisional application No. 61/671,105, filed on Jul. 13, 2012.

(51) Int. Cl.
| | |
|---|---|
| *G05B 19/418* | (2006.01) |
| *G05B 19/4061* | (2006.01) |
| *G06F 17/50* | (2006.01) |
| *G06K 9/00* | (2006.01) |

(52) U.S. Cl.
CPC ..... *G05B 19/4183* (2013.01); *G05B 19/4061* (2013.01); *G06F 17/50* (2013.01); *G06K 9/00355* (2013.01); *Y02P 90/10* (2015.11)

(58) Field of Classification Search
CPC .............. B25J 9/1666; G05B 19/4183; G05B 19/4061; G06F 17/50
USPC ........................................................ 700/248
See application file for complete search history.

(56) References Cited

U.S. PATENT DOCUMENTS

| | | | |
|---|---|---|---|
| 5,280,436 A | | 1/1994 | Kubota et al. |
| 5,495,410 A | * | 2/1996 | Graf ...................... B25J 9/1671 318/568.11 |
| 5,974,643 A | | 11/1999 | Hays et al. |
| 6,816,755 B2 | | 11/2004 | Habibi et al. |
| 7,113,848 B2 | | 9/2006 | Hanson |
| 7,139,642 B2 | | 11/2006 | Kamoto et al. |
| 7,152,050 B2 | | 12/2006 | Aoyama et al. |

(Continued)

FOREIGN PATENT DOCUMENTS

| | | |
|---|---|---|
| EP | 1136193 | 9/2001 |
| EP | 1647369 | 4/2006 |

(Continued)

OTHER PUBLICATIONS

Argall et al. "A Survey of Robot Learning From Demonstration", Robotics and Autonomous Systems, 57(5): 469-483, May 31, 2009.

(Continued)

*Primary Examiner* — Harry Oh

(57) ABSTRACT

A method for defining a robotic machine task. The method comprises a) collecting a sequence of a plurality of images showing at least one demonstrator performing at least one manipulation of at least one object, b) performing an analysis of said sequence of a plurality of images to identify demonstrator body parts manipulating said at least one object and said at least one manipulation of said at least one object, c) determining at least one robotic machine movement to perform said task, and d) generating at least one motion command for instructing said robotic machine to perform said task.

14 Claims, 5 Drawing Sheets

(56) References Cited

U.S. PATENT DOCUMENTS

| | | | |
|---|---|---|---|
| 7,308,112 | B2 | 12/2007 | Fujimura et al. |
| 7,353,082 | B2 | 4/2008 | Pretlove et al. |
| 7,383,100 | B2 | 6/2008 | Ng-Thow-Hing et al. |
| 7,478,073 | B2 | 1/2009 | Kaplan et al. |
| 7,672,913 | B2 | 3/2010 | Kaplan et al. |
| 7,853,356 | B2 | 12/2010 | Tsai et al. |
| 7,953,683 | B2 | 5/2011 | Minamino et al. |
| 8,005,263 | B2 | 8/2011 | Fujimura et al. |
| 8,195,333 | B2 | 6/2012 | Ziegler et al. |
| 8,290,883 | B2 | 10/2012 | Takeuchi et al. |
| 8,401,242 | B2 | 3/2013 | Newcombe et al. |
| 8,478,901 | B1* | 7/2013 | Poursohi ............ G06F 9/5038 700/248 |
| 8,639,644 | B1* | 1/2014 | Hickman ............ G06N 3/008 700/245 |
| 8,843,235 | B2* | 9/2014 | Ota .................... B25J 9/162 700/250 |
| 8,965,576 | B2* | 2/2015 | Chen .................. B25J 9/0087 700/255 |
| 8,984,136 | B1* | 3/2015 | Francis, Jr. ........ H04W 4/02 700/245 |
| 2001/0014781 | A1* | 8/2001 | Nissim ................ A61H 7/001 601/133 |
| 2002/0165638 | A1* | 11/2002 | Bancroft ............. A47F 10/00 700/213 |
| 2004/0093118 | A1* | 5/2004 | Sabe .................. A63H 3/28 700/245 |
| 2005/0177276 | A1* | 8/2005 | Morel ................ B25J 9/1671 700/245 |
| 2005/0271279 | A1* | 12/2005 | Fujimura .......... G06K 9/00355 382/203 |
| 2006/0056678 | A1* | 3/2006 | Tanaka .............. G06N 3/008 382/153 |
| 2006/0253223 | A1 | 11/2006 | Bodenheimer, Jr. et al. |
| 2007/0070738 | A1* | 3/2007 | Gonzalez-Banos et al. . 365/200 |
| 2007/0146371 | A1* | 6/2007 | Dariush ........................ 345/474 |
| 2007/0162164 | A1* | 7/2007 | Dariush .......................... 700/61 |
| 2007/0255454 | A1* | 11/2007 | Dariush ............. G06N 3/008 700/245 |
| 2008/0243307 | A1 | 10/2008 | Toussaint et al. |
| 2008/0252248 | A1 | 10/2008 | Lundberg et al. |
| 2009/0125146 | A1 | 5/2009 | Zhang et al. |
| 2009/0132088 | A1* | 5/2009 | Taitler .................. G05B 19/42 700/264 |
| 2010/0222924 | A1* | 9/2010 | Gienger ............... G05B 19/42 700/246 |
| 2011/0037839 | A1 | 2/2011 | Kurth et al. |
| 2011/0071675 | A1* | 3/2011 | Wells .................. G06K 9/3216 700/250 |
| 2011/0208354 | A1* | 8/2011 | Kato .................. G05B 19/404 700/246 |
| 2011/0211754 | A1 | 9/2011 | Litvak et al. |
| 2011/0221974 | A1* | 9/2011 | Stern .................. G06F 3/017 348/734 |
| 2011/0288667 | A1 | 11/2011 | Noda et al. |
| 2012/0053728 | A1 | 3/2012 | Theodorus et al. |
| 2012/0070070 | A1* | 3/2012 | Litvak .............. G06K 9/00201 382/154 |
| 2012/0123590 | A1* | 5/2012 | Halsmer ............ B25J 9/1656 700/264 |
| 2012/0185090 | A1 | 7/2012 | Sanchez et al. |
| 2012/0235903 | A1* | 9/2012 | Im ..................... G06F 3/005 345/158 |
| 2012/0290132 | A1* | 11/2012 | Kokubo ............. B25J 9/1666 700/255 |
| 2013/0050410 | A1 | 2/2013 | Steinbichler et al. |
| 2013/0076522 | A1* | 3/2013 | Csaszar ............. G06K 7/0008 340/686.1 |
| 2013/0115578 | A1* | 5/2013 | Shiina ............... G09B 21/009 434/112 |
| 2013/0151442 | A1* | 6/2013 | Suh .................... G06N 3/008 706/12 |

FOREIGN PATENT DOCUMENTS

| | | |
|---|---|---|
| EP | 2336948 | 6/2011 |
| EP | 2366502 | 9/2011 |
| JP | 01-120760 | 5/1989 |
| KR | 10-1996-0002246 | 2/1996 |
| WO | WO 2010/030822 | 3/2010 |
| WO | WO 2013/023130 | 2/2013 |

OTHER PUBLICATIONS

Bandera et al. "A Survey of Vision-Based Architectures for Robot Learning by Imitation", International Journal of Humanoid Robotics, 9(1): 1250006-1-1250006-40, 2012.
Field et al. "Human Motion Capture Sensors and Analysis in Robotics", Industrial Robot: An International Journal, 38(2): 163-171, 2011.
Kjellstroem et al. "Visual Object-Action Recognition: Inferring Object Affordances From Human Demonstration", Computer Vision and Image Understanding, 115: 81-90, 2011.
Krueger et al. "Learning Actions From Observations. Primitive-Based Modeling and Grammar", IEEE Robotics & Automation Magazine, 17(2): 30-43, Jun. 2010.
Moeslund et al. "A Survey of Advances in Vision-Based Human Motion Capture and Analysis", Computer Vision and Image Understanding, 104: 90-126, 2006.
Ohashi et al. Patent Abstracts of Japan.
Ude et al. "Task-Specific Generalization of Discrete and Periodic Dynamic Movement Primitives", IEEE Transactions on Robotics, 26(5): 800-815, Oct. 2010.
Yin et al. "Hand Posture Recognition in Gesture-Based Human-Robot Interaction", 1st IEEE Conference on Industrial Electronics and Applications, ICIEA 2006, Singapore, May 24-26, 2006, 6 P., May 2006.
European Search Report and the European Search Opinion dated Feb. 1, 2017 From the European Patent Office Re. Application No. 13175776.7. (19 Pages).
Bodiroza et al. "Dynamic Gesture Vocabulary Design for Intuitive Human-Robot Dialog", 2012 7th ACM/IEEE International Conference on Human-Robot Interaction, HRI'12, Boston, MA, USA, Mar. 5-8, 2012, XP032211941, p. 111-112, Mar. 5, 2012.
Ende et al. "A Human-Centered Appraoch to Robot Gesture Based Communication Within Collaborative Working Process", 2011 IEEE/RSJ International Conference on Intelligent Robots and Systems, San Francisco, CA, USA, Sep. 25-30, 2011, XP032200789, p. 3367-3374, Sep. 25, 2011. Abstract, p. 3371-3374.
Pastor et al. "Skill Learning and Task Outcome Prediction for Manipulation". 2011 IEEE International Conference on Robotics and Automation, Shanghai, China, May 9-13, 2011, XP032034021, p. 3828-3834, May 9, 2011.
Stoughton et al. "Robotic Design Analysis Based on Teleoperated Manipulator Data Collection", Robots 9, Conference Proceedings, Detroit, MI, USA, Jun. 3-6, 1985. XP055337114, 2: 15.55-15.76, Jun. 3, 1985. Abstract.
Sugiyama et al. "Natural Deictic Communication With Humanoid Robots", Proceedings of the 2007 IEEE/RSJ International Conference on Intelligent Robots and Systems, San Diego, CA, USA, Oct. 29-Nov. 2, 2007, XP031222119, TuD11.5: 1441-1448, Oct. 29, 2007. p. 1444-1446.
Partial European Search Report dated Sep. 29, 2016 From the European Patent Office Re. Application No. 13175776.7.
Billard et al. "Robot Programming by Demonstration", Handbook of Robotics, XP055302667, Chap.59: 1371-1394, May 20, 2008.
Eppner et al. "Imitation Learning With Generalized Task Descriptions", 2009 IEEE International Conference on Robotics and Automation, XP031509700, Kobe, Japan, May 12-17, 2009, p. 3968-3974, May 12, 2009.

* cited by examiner

NATURAL MACHINE INTERFACE SYSTEM

RELATED APPLICATIONS

This application claims the benefit of priority under 35 USC §119(e) U.S. Provisional Patent Application Nos. 61/669,144 filed on Jul. 9, 2012 and 61/671,105 filed on Jul. 13, 2012, the contents of which are incorporated herein by reference in their entirety.

FIELD AND BACKGROUND OF THE INVENTION

The present invention, in some embodiments thereof, relates to machine interfaces and, more particularly, but not exclusively, to robotic machine interfaces for interfacing with robotic machines.

Many industrial applications of robotic machines include robotic machines working together as a robotic team. These teams of robotic machines include machines of multiple designs, manufacturers and generations. Assigning the tasks for each robotic machine, communication between operators and robotic machines, obstacle avoidance, collision avoidance, and design optimization of future robotic machine units become expensive and time consuming processes. The terms machine and robotic machine are used herein interchangeably, and both refer to any machine that has the ability to be controlled.

While many methods exist to define a robotic machine the task to be performed, such methods typically require a programming engineer and a process engineer together to setup the task using basic machine movement instructions, and then fine tune these motions on a step by step manner until the new robotic machine task is refined enough for actual operation. In these cases the robotic machine typically responds with messages to the engineers through a programming console by text messages. When taking these constraints into account, and factoring in the high degree of product variations, short production cycles, and constant changes to production lines, the effort of using skilled programmers to make changes translate into about half the overall robotic automation project costs. These tasks of defining robotic abilities, coordinating tasks between robots, and optimizing each robotic task and the team coordinated operation falls on the highly skilled designer/programmer to resolve.

Imitation-based movement learning for robotic machines has been described by Gienger in U.S. Application publication number 2010/0222924, which the content thereof is incorporated herein by reference. This invention proposes a method for imitation-learning of movements of a robot, wherein the robotic machine performs the steps of: observing a movement of an entity in the robot's environment; recording the observed movement using a sensorial data stream and representing the recorded movement in a different task space representations; and selecting a subset of the task space representations for the imitation learning and reproduction of the movement to be imitated.

SUMMARY OF THE INVENTION

According to some embodiments of the present invention, there is provided a method for defining a robotic machine task. The method comprises collecting a sequence of a plurality of images showing at least one demonstrator performing at least one manipulation of at least one object, performing an analysis of the sequence of a plurality of images to identify demonstrator body parts manipulating the at least one object and the at least one manipulation of the at least one object, determining at least one robotic machine movement to perform the task, and generating at least one motion command for instructing the robotic machine to perform the task.

Optionally, the sequence of a plurality of images is collected by at least one depth map sensor.

Optionally, the sequence of a plurality of images is collected by at least one digital camera.

Optionally, the robotic machine task is to perform the object manipulation modified by any combination of scale, translation, rotation, symmetry, skew, or shear transformations in the space or time dimensions resulting in a modified object manipulation task by the robotic machine.

Optionally, the motion commands are adjusted to take into account robotic machine capabilities of different types, makes, and models.

Optionally, the demonstration is performed by any type of demonstrator: human, animal or machine.

According to some embodiments of the present invention, there is provided a method for communications between a human operator and at least one controller associated with at least one robotic machine. The method comprises receiving at least one sequence of a plurality of images imaging a human operator performing at least one gesture by moving at least one body part, performing an analysis of the sequence of a plurality of images to identify the at least one gesture, identifying an association between the at least one gesture and at least one command to be executed, and instructing a robotic machine with the at least one command.

Optionally, the at least one sequence of a plurality of images is collected by at least one depth map sensor.

Optionally, the at least one sequence of a plurality of images is collected at least one at least one digital camera.

Optionally, the at least one command to be executed comprises associating a subset of the identified at least one body part movement with another at least one command to be executed.

Optionally, the at least one command to be executed is assignment of at least one message from the at least one controller to human operator by movement of at least one robotic machine part to mimic intuitively understood human body language.

According to some embodiments of the present invention, there is provided a method for enhancing at least one robotic machine's design. The method comprises gathering usage data of a plurality of technical elements from at least one robotic machine while the at least one robotic machine performs at least one task; statistically analyzing the usage data to determine statistically at least one desired parameter for each of the plurality of the technical elements and using the at least one desired parameter of each of the plurality of technical element usage to generate a new design defining at least one change to a current design of the at least one robotic machine.

Optionally, the at least one change is a change to robotic machine's hardware.

Optionally, the at least one change is a change to robotic machine's software.

Optionally, the at least one change is a change to robotic machine's processing algorithm.

Optionally, the usage data is acquired by at least one associated controller through analysis of at least one sequence of a plurality of images collected by at least one spatial sensor.

Optionally, the usage data is acquired by at least one associated controller through robotic machine movement history.

Optionally, the usage data is software usage.

Optionally, the performance at least one desired parameter is any combination of robotic machine's cost, maintenance cost, speed of performing task, precision of performing task, weight, dimensions, strength, power, throughput, and other unspecified production relevant parameter.

More optionally, the at least one spatial sensor is at least one depth map sensor.

More optionally, the at least one spatial sensor is at least one digital camera.

Optionally, the robotic machine design's is software design.

Optionally, the robotic machine design's is hardware design.

According to some embodiments of the present invention, there is provided a method to reduce the risk of collision between at least one first robotic machine and at least one second robotic machine in the surrounding environment. The method comprises collecting scene and motion data imaging the at least one second robotic machine performing at least one robotic machine task, performing an analysis of the scene and motion data to identify at least one location of at least one part of each of the at least one second robotic machine, identifying at least one task being performed by the at least one second robotic machine, and using the identified at least one location of the at least one part and the identified task to determine at least one movement limit for at least one part of the at least one first robotic machine to reduce a risk of collision between the at least one second robotic machine and the at least one first robotic machine.

Optionally, the motion data is acquired through analysis of at least one sequence of a plurality of images collected by at least one spatial sensor showing the at least one robotic machine in motion.

More optionally, the at least one spatial sensor is at least one depth map sensor.

More optionally, the at least one spatial sensor is at least one digital camera.

Optionally, additional motion data is acquired through analysis of movement history data transferred from other robotic machine's controller.

Optionally, the identified locations includes compensation for at least one object being manipulated by the robotic machines.

Optionally, the motion data includes compensation for at least one object being manipulated by the robotic machines.

According to some embodiments of the present invention, there is provided an apparatus associated with at least one robotic machine. The apparatus comprises at least one spatial sensor for collecting a sequence of plurality of images, at least one processing unit which analyses a sequence of a plurality of images to identify at least one task objective, determining at least one robotic machine movement to perform, and generating at least one motion command for instructing the robotic machine to perform, at least one processing unit which analyses a sequence of a plurality of images to identify at least one technical usage characteristic of the at least one associated robotic machine, at least one storage unit to save the sequence of a plurality of images, the at least one processed robotic machine motion, at least one processing algorithm, the at least one motion command, and the at least one technical usage characteristic, at least one digital communication method to communicate the at least one motion command to the at least one associated robotic machine, at least one digital communication method to communicate the at least one technical usage characteristic to at least one statistical analysis system, and housing for containing the at least one spatial sensor, the at least one processing unit, the storage unit, and the communication method, the housing being configured for being suitable for the environment of the robotic machine.

Optionally, the at least one spatial sensor consists of at least one depth map sensor.

Optionally, the at least one spatial sensor consists of at least one digital camera.

Optionally, the at least one digital communication method is any digital communication method typically or atypically used in the working environment of the associated at least one robotic machine, including, but not limited to, wired Ethernet, wireless Ethernet, serial communication standards, parallel communications standards, infrared communications, wired universal serial bus, wireless universal serial bus, Bluetooth communication, or any type of typical or atypical industrial automation protocol.

Unless otherwise defined, all technical and/or scientific terms used herein have the same meaning as commonly understood by one of ordinary skill in the art to which the invention pertains. Although methods and materials similar or equivalent to those described herein may be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention may involve performing or completing selected tasks manually, automatically, or a combination thereof. Moreover, according to actual instrumentation and equipment of embodiments of the method and/or system of the invention, several selected tasks could be implemented by hardware, software or firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions.

Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF EMBODIMENTS OF THE INVENTION

Figure 1:
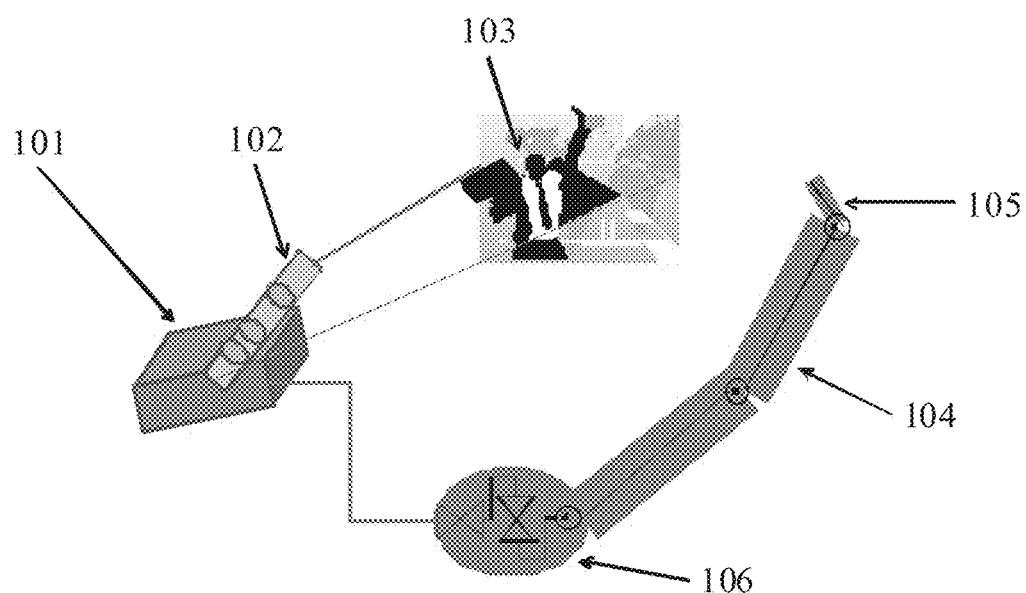
FIG. 1 is a schematic illustration of an industrial robotic machine with a controller dynamically track joints of a human and, based on it, generates movements of industrial robot's joints that may replicate as close as possible the ones detected on the human, according to some embodiments of the present invention.

According to some embodiments of the present invention there are provided devices and methods for improving robotic machine capabilities. The devices and methods described here may be implemented using a universal controller (henceforth "controller") that is associated with one or more robotic machines and allows robotic machine (henceforth "machine") task learning through demonstration, communication between machine and human using intuitive gestures, future machine design improvement planning, and reduced risk of machine collision.

According to some embodiments of the present invention, there are provided methods and devices for robotic machine task learning through imaging human or robotic machine demonstration. The demonstration is imaged using one or more spatial sensors, such as one or more depth map sensors and/or one or more cameras. The captured data is analyzed to identify and optionally track the movement and location of one or more demonstrators and/or the changes to one or more objects which are manipulated by the demonstrator(s). This may allow determining motion paths and calculating robotic machine actions that achieve the desired object manipulations.

Optionally, a task is modified by any affine transformation in space, including unity transformations. These transformations may be any combination of scale, translation, rotation, symmetry, skew, and shear transformations. For example if the task requires assembly of a very small scale object, the demonstrator performs the task on a much large scale mockup of the object assembly, and indicates to the controller that the robotic machines should perform this assembly on the target object scale. In another example, the affine transformation performs a rotation transformation, for example the demonstration of screwing in a light bulb is done on a table with the housing facing up for convenience, but the operator commands the controller to perform the same task on the ceiling.

Optionally, the controller records specific three dimensional positions in space and then selects, either automatically or with operator guidance, the type of movement path desired between these positions. For example, the movement path is a straight line, circle or ellipse.

Optionally, a task is modified by one or more affine transformations in time. These transformations may be scale, translation, rotation, symmetry, skew, and/or shear transformations. For example an assembly task is demonstrated to a learning component, such as a controller, along with a symmetry transformation in time command, and the robotic machine performs the same operation in reverse or disassemble the object. In another example, the scale transformation in the time dimension is applied to the demonstration, resulting in the robotic machine performing the task either slower or faster than the original demonstration depending on the needs of the task.

Optionally, before and/or after the demonstration, the operator submits a command to the controller to perform the task using a transformation in space and/or time, such as in an example performing the task performed during the demonstration at double the speed and/or movement length scale. If later during fine tuning of the task this is found to be too fast for the kinetics of the object and part, the speed may be reduced so that the robotic machine performs the task at the optimal speed.

Optionally, the machine is of any type of industrial, service, military and domestic robotic machines.

Reference is now made to FIG. 1, a schematic illustration of a controller learning a task for a robotic machine from a demonstrator, according to some embodiments of the present invention. Optionally, controller 101 uses spatial sensor depth maps and/or digital cameras 102, for instance by creating depth maps, to collect a sequence of images showing human demonstrator 103 performing a task and after analyzing the images to identify demonstrator's body parts and object manipulation, instructing robotic machine 104 to mimic demonstrated motion and object manipulation by issuing motor commands to machine motors 106 that move joints and manipulators 105.

Optionally, the image sequence is analyzed by the controller 101 to segment the demonstrator's body parts and/or the robotic machines parts, for example, in the case of a human demonstrator, torso, head, arm, leg, feet and/or hand are segmented. The image sequence is also analyzed to segment the object(s) manipulated by the demonstrator, the orientation and/or position of the object relative to the demonstrator, and the effect that the manipulation has on the object, such as, but not limited to, changes of relative positions, orientations, assembly, content or shape.

Optionally, the segmented object images are processed to determine the object path and optimized to simplify the object movement description. Algorithms for simplification of task such as rapidly exploring random trees, nearest neighbor, curve fitting, smoothing, and/or Monte Carlo algorithms may be used to optimize the object movement. Application of each of these algorithms produces an alternative processed task description that may be invoked by the robotic machine to perform the task. The optimized object movement descriptions are further processed to be within the capabilities of the specific associated robotic machine learning the new task, such as, but not limited to, degrees of freedom, range of motion, and available manipulators. Once the data is captured and processed, it is translated into robotic machine instructions that may be executed on the specifically associated robotic machine.

Optionally, the motion descriptions are translated to machine instructions for multiple makes and models of robotic machines.

Optionally, when a predefined gesture is identified from the analysis of the image sequence, the learning mode is activated and a demonstrator to learn from is chosen when there is more than one potential demonstrator identified in the environment.

Optionally, this mode is aborted by the demonstrator at any time. During this learning mode the demonstrator body parts and/or object(s) to be manipulated are identified by the controller. These body parts along with the objects are then tracked until the demonstrator indicates, for instance, by predefined gesture that the demonstration has been completed and/or should be restarted.

Optionally, the learning mode is performed in an online mode and/or an offline mode. In an online mode, each object movement is translated directly to the robotic machine and reproduced in real-time, within the limitations of the robotic machines capabilities. In offline mode, the body part positions of the demonstrator and/or object movements are tracked and stored. In either mode the operator has access to each of the components: captured data, processed data, and/or robotic machine's low level instructions, including methods to allow an operator to easily review and edit these data.

Optionally, the demonstrator is a human, other robotic machine, or animal. For example, and additional to the human example above, when one machine is to replace another, older machine, the controller of the new machine learns the task to be performed from the old one. Another example is that the robotic machine will learn to carry loads and avoid obstacles by observing a pack animal operating in the target environment.

Optionally, an example of task learning by demonstration is performed as follows. Operator signals to the controller that a learning session is to begin, by for example raising a single finger to the controller. The controller responds by raising the robotic machine manipulators to indicate acknowledgement. If more than potential demonstrator is identified in the work area, the controller asks for direction to identify the demonstrator, for example by sweeping the manipulator across the potential demonstrators back and forth. The demonstrator may then raise his hand and wave at the spatial sensor, indicating that they are the demonstrator. The controller responds by rotating the robotic machine towards the demonstrator, and starting a spatial sensor recording of the demonstration producing a sequence of images. The demonstrator then performs the task to be learned, such as scanning a barcode attached to object, picking up object from conveyer belt, assembling a cover from a bin of parts to object, and placing the object back on the conveyer belt. The demonstrator indicates that the demonstration has stopped, for example by raising a closed fist. The controller acknowledges the stop learning mode command with, for example, a raised manipulator. The controller processes the sequence of images to identify the demonstrator body parts participating in the manipulation of the object, the parts needed to manipulate the object and the resulting changes to the object using, for example, typical computer vision image segmentation and classification algorithms. The resulting identified manipulator and object motions may then be converted to the associated robotic machine motions that best perform the same task using one of a plurality of algorithms.

Optionally, following this example, all manner of tasks are learned by the controller.

According to some embodiments of the present invention, a "machine" may be defined as a chassis and associated part groups that are controlled by a given controller. Machines' descriptors may be defined as sets of data that characterize the machine's configuration and layout. This may include, but is not limited to, sizes, depth map, 3D model, markers, colors, relative locations of joints, special markers identifying the joints, weight, power, limitations, etc. These descriptors may characterize a specific machine part, a set of machine's parts and/or an overall machine.

Figure 3:
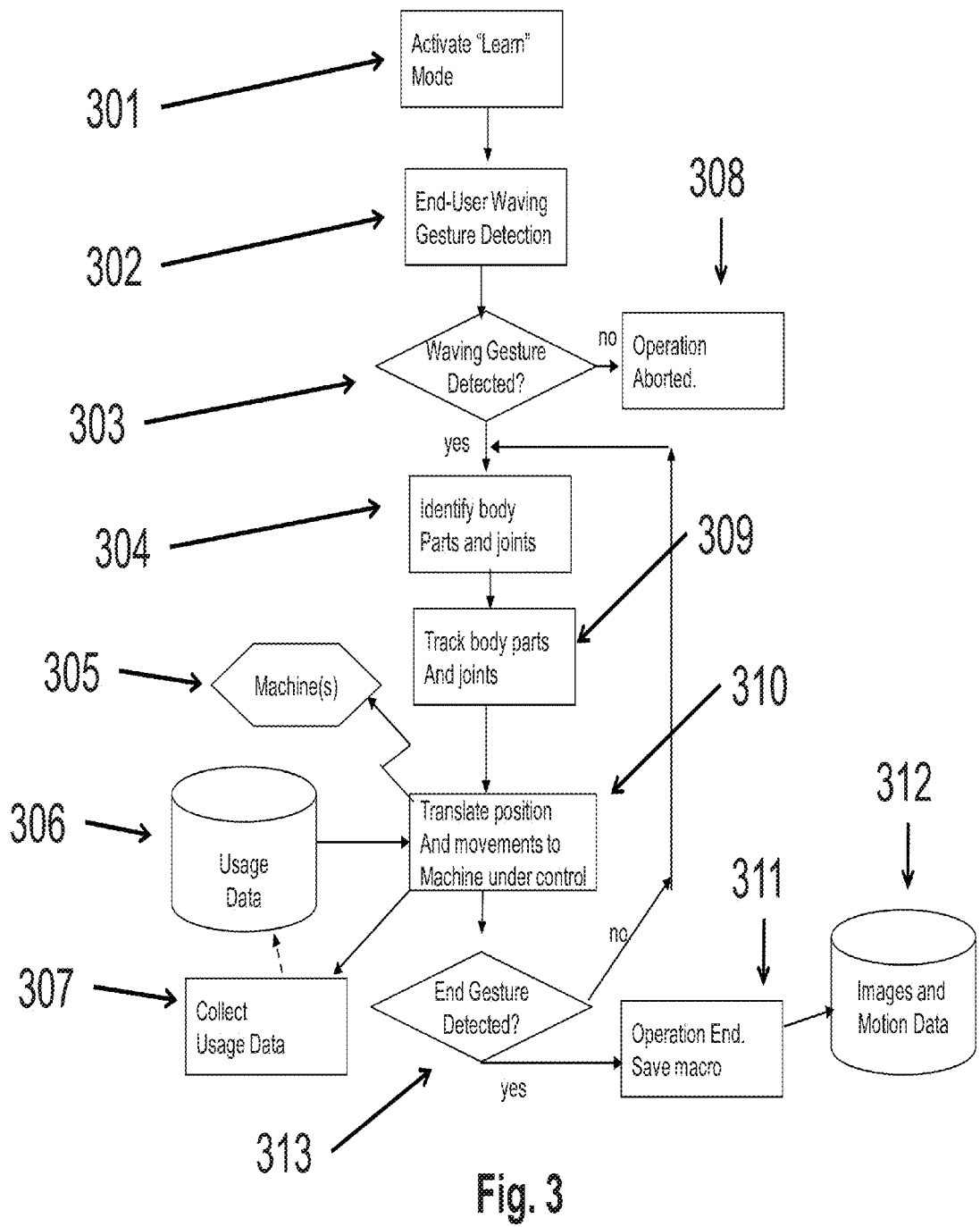
FIG. 3 is a flowchart of a method for demonstration based learning session to a robotic machine, according to some embodiments of the present invention.

Reference is now made to FIG. 3, a flowchart of one embodiment described herein for clarification, according to some embodiments of the present invention. Optionally, some embodiments of the present invention have the following controller commands and processing steps to learn by demonstration. An Activate Learning Mode step 301 from demonstrator to controller. Controller then performs Demonstrator Gesture Detection step 302. Optionally, demonstrator issues Learn mode Aborted 308 command. Controller may perform Identify body parts and joints step 304. Subsequent to this controller my perform Track body parts and joints step 309. Other controller steps include Translate position and movements to a machine under control 310 and Collect Usage Data 306. Finally, the demonstrator may tell controller to perform Learn End-Save Macro step 311.

Optionally, a pre-defined waving gesture 302 is defined to allow the visual system to detect the demonstrator that is to be tracked in order to reproduce its movements and positions on the machine. Software, such as OpenNI, offers functionality to perform this wave gesture recognition in a relatively easy way.

Optionally, if no waving gesture is detected from a demonstrator in range of the visual system connected to the controller, after a predefined time period, the learn-mode from demonstrator is aborted 308.

Optionally, through the visual system, the controller detects joints and body parts 304.

Optionally, software such as OpenNI is used for this identification.

Optionally, body parts and their movements are tracked by the controller 309.

Optionally, OpenNI software modules is used for this tracking.

Optionally, controller translates position and movements to a machine under control 310. Optionally, learning mode is performed online or offline. In online mode, each movement may be translated directly to the machine and reproduced in real-time. In offline mode, body parts positions and movements may be tracked and saved for future use. Translation from the movements and positions detected on the demonstrator to the robotic machine is possible using the machine's and machine parts' descriptors. Translation may not be exact as it depends on the particular machine's configuration, number of axes, sizes, etc.

Optionally, replication of the movements only follows one of the joints of the demonstrator. For example, a controller controlling a 4 axis mechanical arm, will try to follow the demonstrator's hand position and perform similar trajectory with the endpoint of the mechanical arm. Some variation may be allowed based on a pre-defined threshold. The controller may use the same mechanism disclosed in previous stages to detect the machine actual movements through the depth map sensors and/or cameras and compare them to the relative movements and body trajectory performed by the demonstrator.

Optionally, the controller uses a sensory for detecting demonstrator body part and object motion that records a plurality of three dimensional positions.

Optionally, the recorded one three dimensional positions are processed by the controller to define the movement type of machine manipulator and object.

Optionally, usage data is collected 306 on the actual performance of the identification, tracking and task replication on machine. Based on this data, future processes may use different design specifications to perform similar actions.

Optionally, task data is saved in the form of a macro 311 for future execution. In other cases, the process may be used dynamically as part of a robotic machine task that needs to coordinate machine movements with that of an operator, or perform instructions communicated by the operators as gestures or voice commands.

Optionally, sequence of images collected showing demonstrator manipulating object is segmented using computer vision and/or OpenNI methods to identify and track both demonstrator body parts, the object being manipulated, and the interaction between the two. This tracking and interpretation may make the machine learning feasible.

Optionally, the raw tracking data, identified demonstrator body parts, manipulated object, interaction between the two, and processed machine movements is edited by the operator through controller commands communicated by operator body gestures.

Optionally, the demonstration learning is applied to machines performing polishing, painting, dip soldering, or any other manufacturing or industrial task.

According to some embodiments of the present invention, the robotic machine operator may signal operational commands to the controller and robotic machine using human gestures. For example, the demonstrator teaches the controller gestures that indicate for start learning mode, stop learning mode, save task, abort learning task, or perform affine transformation.

According to some embodiments of the present invention, there are provided methods and systems of teaching a robotic machine to perform a human-like gesture for signaling data to a human user and/or another robotic machine. These gestures may mimic human body language and thus have intuitive meaning for the operator. For example, the demonstrator shows the robotic machine a positioning of the robotic machine manipulators, such as a raised manipulator, that communicate to the demonstrator that the robotic machine requires to pause the learning of the task. Once the demonstration is paused, the robotic machine may then communicate to the demonstrator, such as by counterclockwise rotation of the manipulator stopping at the 10 o'clock position, to repeat the last 10 seconds of the demonstration.

Optionally, the operator demonstrates gestures by movement of their body and command the controller to associate these gestures with one or more predefined commands. For example, the operator shows the controller the hand sign for start learning mode, associate the sign with the controller command, ask the controller to verify the hand sign, and store this sign to be associated with the command. Another example would be that the operator assigns another hand sign to the series of controller's commands including stop learning mode, return all objects to initial positions, restart learning mode so that the demonstrator restarts the demonstration with one hand sign if an error was made.

Optionally, the operator commands the controller to position and/or move the robotic machine in a manner mimicking a human body language gesture associated with a message that the controller wants to send to the operator. For example the operator commands the controller to raise and lower the manipulator three times when the controller sends a "yes" message to the operator. Another example would be that the operator commands the controller to move the manipulator from side to side three times when the controller sends a "no" message to the operator.

According to some embodiments of the present invention, there are provided methods and systems that may improve robotic machine design by statistical analysis of actual technical usage data collected from one or more robotic machines.

According to the presently disclosed subject matter there is provided a methods that enable a machine or, more specifically a robotic machine, to recognize and track its own parts and other robot's parts and position dynamically.

Optionally, a machine version is defined by different characteristics including for example, its size, strength, degrees of freedom, number of actuators, technical specifications of its actuators, number of processors and processors capabilities, number of mechanical hands, number of mechanical fingers per hand and software applications, among others.

Figure 2:
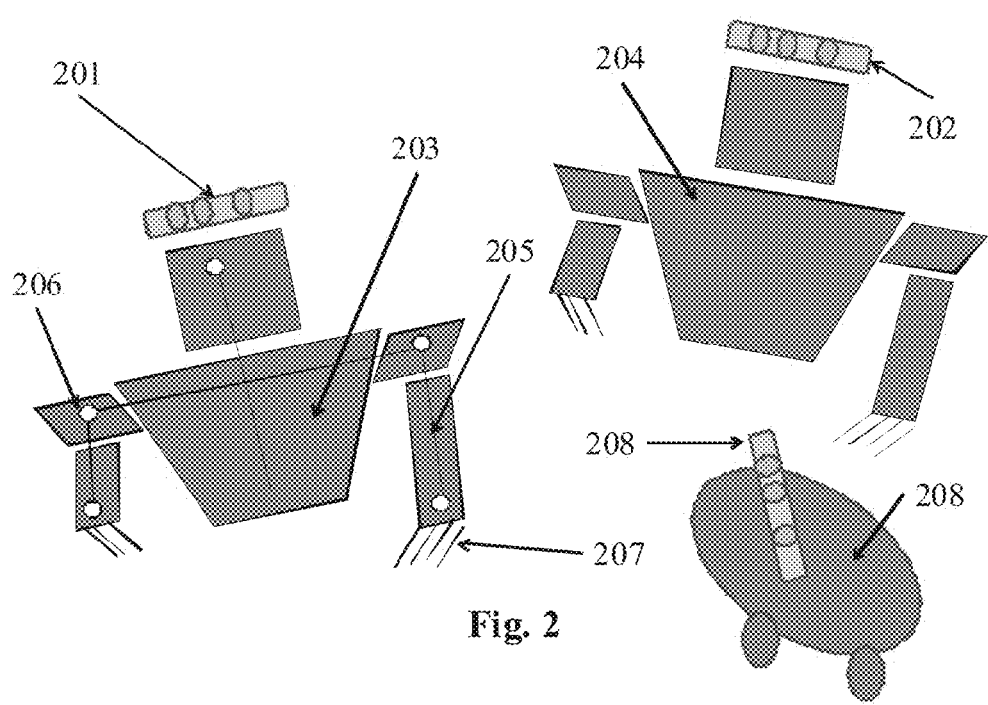
FIG. 2 is a schematic illustration of robotic machines using a controller with spatial sensor to detect its own parts positions relative to themselves and relative to the parts of other robotic machines using a controller, according to some embodiments of the present invention.

Reference is now made to FIG. 2, a schematic illustration of several robotic machines operating in the same environment, according to some embodiments of the present invention. Each robotic machine (203, 204, and 208) may have an associated controller (201, 202, and 208 respectively) that share usage data and robotic machine descriptors. During operation of each robotic machine performing its assigned task, it's own and the other robotic machines' controllers may use the spatial sensors to identify and track each other's machine parts and the one or more objects being manipulated. These machines may be of different types as shown by the differences between 203 and 208.

Optionally, the collected data includes information about actual usage of technical abilities of a robotic machine. The data is collected while the robotic machine(s) perform task(s) allocated thereto. The data optionally includes information about the respective tasks and environmental information such as temperature, terrain, density and/or any other measurable characteristic that has an effect on the task performances. This analysis may allow making future robotic machine specification adjustments, for example providing recommendations for a future design with a larger or smaller number of joints, longer or shorter actuators, stronger or weaker motors, etc.

Optionally, the usage data includes information on image processing and tracking algorithm performance. This software usage data may be analyzed to determine optimal future machine software designs.

Optionally, the usage data is collected by one or more controllers and used dynamically to improve performance of current and future tasks.

Optionally, this usage data is collected using one or more spatial sensors, such as depth map sensor(s) and/or one or more cameras.

Optionally, this usage data is collected directly from the robotic machine controller's motion history log.

Optionally, actual usage data is recorded with data about object(s) being manipulated and/or processed and/or treated by the robotic machine and/or related environmental information to further assist these improvements.

Optionally, the robotic machine technical abilities include data such as the degrees of freedom, range of articulating joints, manipulator reach, manipulator types, speed and power of motors, and appearance.

Optionally, actual technical usage data is collected during operation of the robotic machines, and includes, but is not limited to, statistics on the usage of each robotic machine's capabilities, metrics for task completion time, maintenance performed on the robotic machines, and quality assurance information on the task being performed such as accuracy of object manipulation monitored by spatial sensors, such as depth map sensors and/or digital cameras.

Optionally, these methods and devices help designers to create new generations of robots that are optimized for operational needs (i.e. shorter arms, stronger motors, specific combination of algorithms, etc). Improvement may be planned as actual technical usage data is collected on and assists in designing a new robotic machine that is physically and/or logically more optimally adjusted to the object manipulation tasks and/or operational environment.

Figure 5:
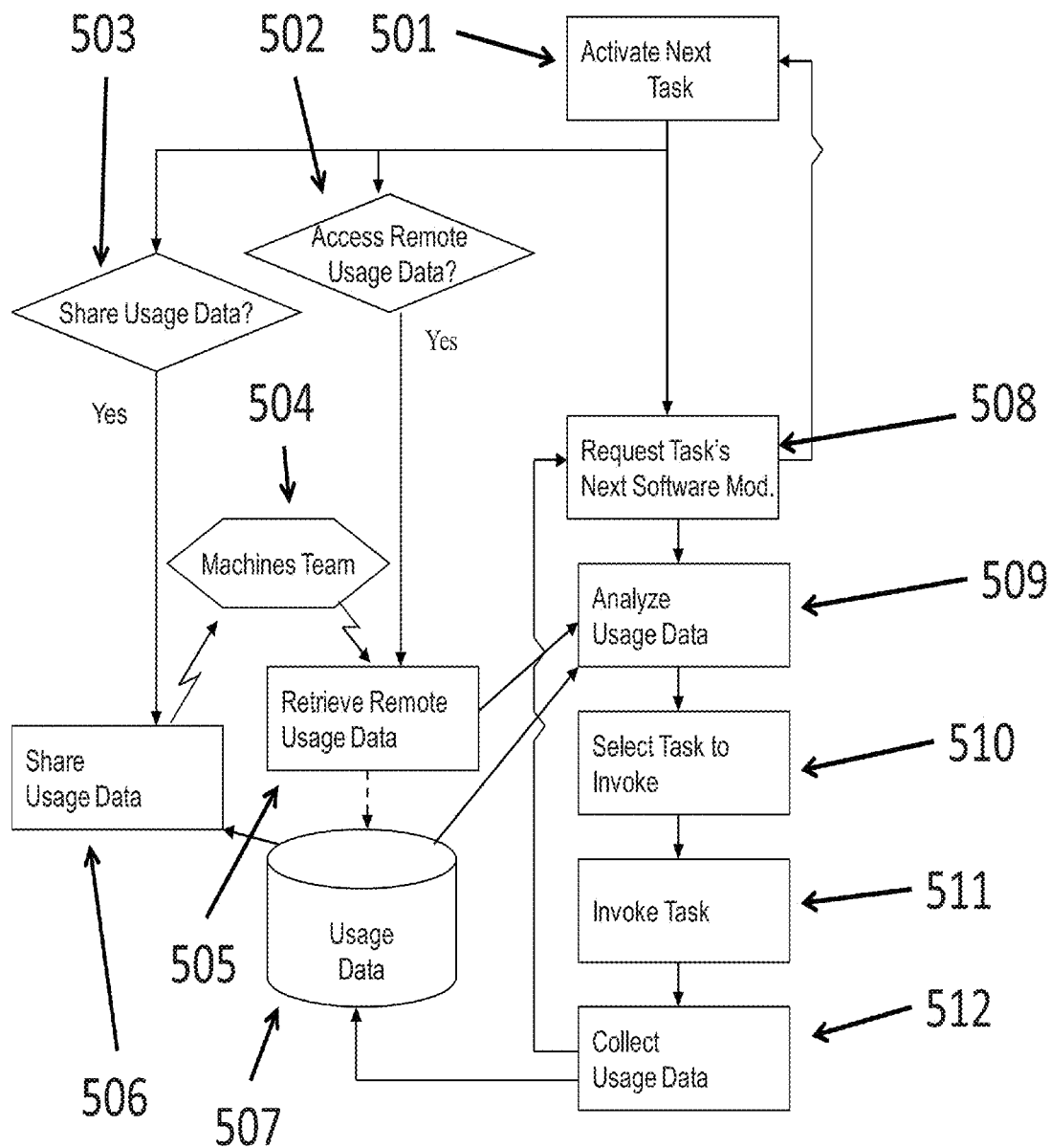
FIG. 5 is a flowchart of a method of robotic machine controller's sharing usage data, according to some embodiments of the present invention.

Reference is now made to FIG. 5, a flowchart of a collecting usage data during task operation, according to some embodiments of the present invention. During the performance of machine tasks (501, 508, 510, and 511) the machine may collect its own usage data 512, gather data collected by other controllers 505, and analyze these data 509. These data may be also stored locally 507 and shared back to the other controllers in the nearby area.

Optionally, the collecting of these data may be done through conventional digital communication means from the robotic machines, for example, but not limited to, wired or wireless local area network, or serial communications, such as USB or RS232.

For example, the usage data may include information on the speeds a specific motor of a specific model of robotic machine was operated at during performance of a task. Optionally, this usage data may be collected from more than one robotic machine of the same model performing more than one different task. The statistical analysis of this usage data, such as mean, standard deviation, 95% confidence intervals may then be used when designing the next revision of this model of robotic machine and the step motor specification requirements changed so that the step motor is better suited to perform the analyzed range of speeds. This may result, for example, in a motor that has lower cost, higher speeds, or lighter weight, all depending on the design revision goals of the new robot.

Optionally, a similar approach is used to collect information on performance of specific algorithms that are invoked alternately to achieve similar tasks. The collected information may then be used to favor one alternative over the other in future tasks based on their performance scores.

According to some embodiments of the present invention, there are provided methods and devices for dynamically adapting robotic machine movement, behavior and/or actions based on reach and/or technical abilities of one or more peer robotic machines working in proximity thereto, with or without collaboration therewith. This may allow reducing or eliminating the risk of collision when performing common or separate tasks in the same environment.

Optionally, the robotic machine technical abilities include data such as the degrees of freedom, range of articulating joints, manipulator reach, manipulator types, speed and power of motors, and appearance.

Optionally, the device issues movement commands to a robotic machine, uses a spatial sensor, such as depth map sensors and/or cameras, for tracking its own or other robotic machine's parts, and associates the movements of each part with the commands issued. This may allow each device to learn its own or other robotic machine's technical abilities, and by monitoring the robotic motions during task performance the device reduces or eliminates the risk of collision between the robotic machines and/or the objects they are manipulating.

For example, the device communicates a movement command to its associated robotic machine to rotate the first joint by 5 degrees clockwise, purposefully starting with small rotation to avoid calibration errors. During this rotation the device may acquire a sequence of images, segment these images to identify the parts of the robotic machine, and record the association between the resulting joint movement and the command. The device may then communicate to the robotic machine to move the first joint by 10 degrees, and repeat the process. Thus, in a stepwise manner, the device may safely determine the technical abilities of this joint of the associated robotic machine. Similarly, the robotic machine may determine all technical abilities of the associated robotic machine.

Figure 4:
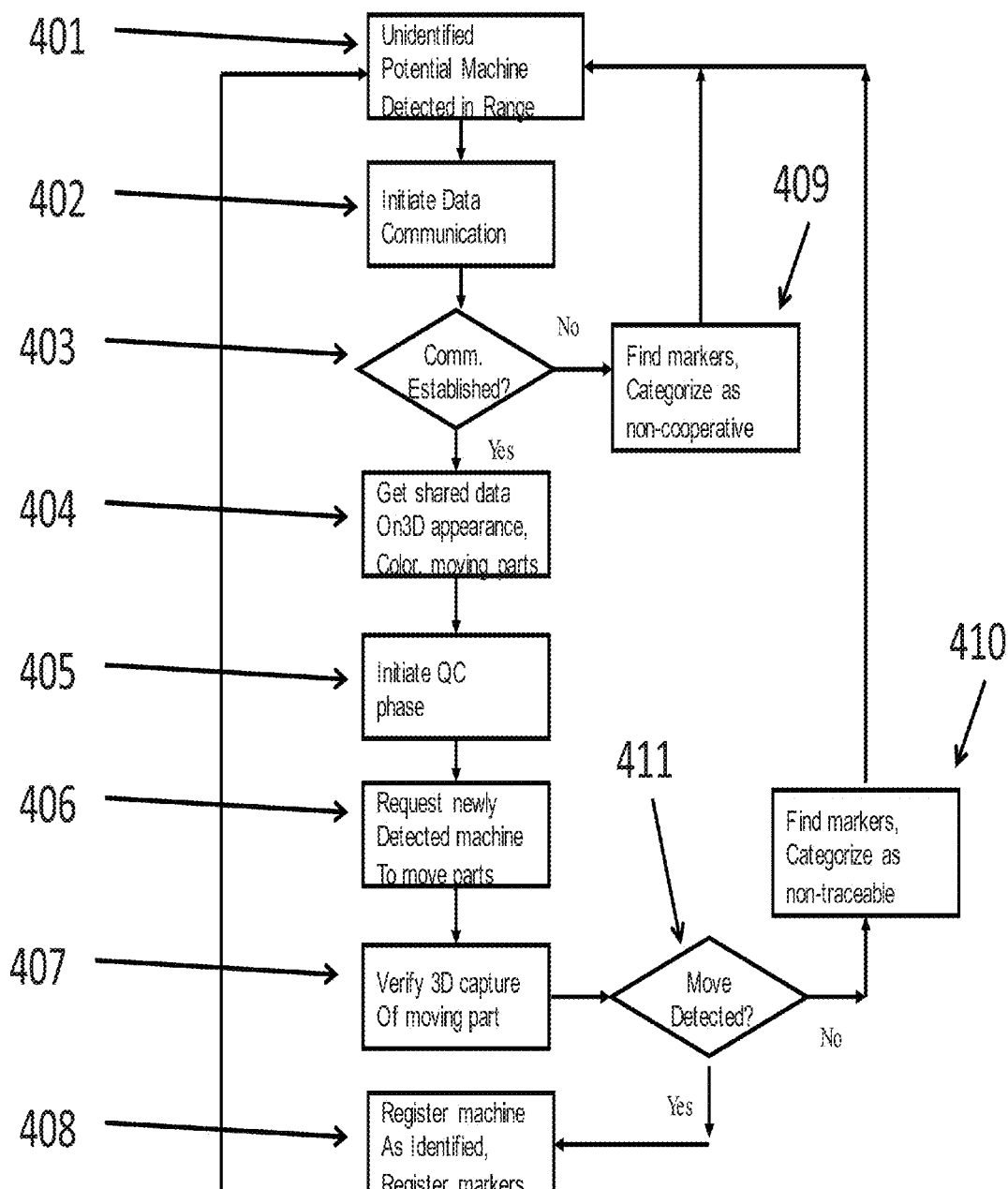
FIG. 4 is a flowchart of a method for the initial robotic machine identification process, according to some embodiments of the present invention.

Reference is now made to FIG. 4, a flowchart of a communication and identification task to visually identify the motion range of nearby machines, according to some embodiments of the present invention. Optionally, the controller identifies nearby machines 401 and attempts to communicate with their controllers 402. If successful, it may retrieve machine descriptions 404 of the nearby machines. The controller may correlate between the descriptions and captured images 405 and/or attempt to initiate motion in the robotic devices 406 in order to identify the machines. If the controller identifies machines that do not communicate it may categorize these as non-cooperative 409 and/or attempt to identify markers 410.

Optionally, by issuing these movement commands to another robotic machine, the device validates the appearance and technical ability of other robotic machines working within range of the sensory means.

Optionally, the device communicates with other controllers associated with the other robotic machines in the environment, share the robotic machine technical abilities directly, and, subsequent to a few simple motions to align the two devices' coordinate systems, determine the relative technical abilities between the two robotic machines. Thus once all robotic machines in the environment have been identified, their technical abilities determined, and coordinate systems aligned, the controller may monitor the movements of the robotic machines and the objects being manipulate, and reduce or eliminate the risk of collision.

For example, when a new robotic machine is placed in an assembly line with other existing robotic machines already configured to perform certain tasks, the new robotic machine's controller may observe the other robots performing their tasks, and from the motion of the robotic machine parts and objects they are manipulating determine the safe zone where this robotic machine may move.

Optionally, if there are controllers associated with the existing robotic machines they may transfer the digital data of the robotic machine descriptors, including the reach of the robotic machine to the new robotic machine controller, and the new controller may use this information to limit the movement of the new robotic machine. Optionally, in the case of controllers attached to all robotic machines in the same environment, they may share their positions and planned movements in real time so that robotic machines my overlap their movements in the same spaces at different times.

According to some embodiments of the present invention, there are provided methods and devices for a scalable, universal, general-purpose machine controller associated with one or more robotic machines, that is able to identify the robotic machine that it's controlling, this machine's parts and other machines and their parts in its environment.

Optionally, and for illustration purposes only, the detailed description refers in many the cases to examples and embodiments where the machine is a robot, however it should be noted that other machines may be controlled with similar technology and therefore this example should not be construed as limiting.

According to some embodiments of the present invention, the controller may assess the environment using depth map sensors and/or cameras, or through information sent by the data communication means from another controller or device. A machine's controller may detect unidentified objects with or without markers that resemble another potential machines in range.

Optionally, a machine's controller may broadcast a data message to other machines and request engagement in mutual or individual identification process.

Optionally, the markers detected from the depth map sensors and cameras may be pre-established and may be updated periodically based on past-data of similar identification processes or manufacturers data.

Optionally, other moving or static objects might be considered as potential machines and an identification process may be triggered.

Optionally, the message may be broadcasted through network means or, alternatively, a sound code may be generated by the broadcasting controller and captured by the other controller's spatial sensors or microphone devices.

According to some embodiments of the present invention, each machine's controller may have a unique ID. Each parts group associated with this machine may have a unique ID, as may each part within the group. A part or group of parts may also have a Type ID that may relate it to all similar machines and similar machines parts.

Optionally, communication may be established either through wireless or cabled network between the two controllers or between the controller and the machine's motor drivers.

Optionally, a sound system may be used to communicate between controllers. Each controller may generate a particular code sound associated with each letter or number, and this sound is captured by the other controller using at least one microphone and decoded.

Optionally, a request may be broadcasted and one or more machines receiving the broadcast may answer with an acknowledgment. From that point on, a peer-to-peer communication may be established between the two controllers. Optionally, this communication may be established through network sockets.

Optionally, the controller may identify every particular part and group of parts comprising the whole machine. This identification may be performed through the depth map sensors and/or cameras. Optionally, as part of the identification stage, machine parts may be uniquely identified when the machine overall design is provided with adequate identification facilities for identifying the machine parts. Optionally, other techniques, such as bar coding, magnet labels, radio frequency labels (RFID), color labels and others, may be used in different machine types to uniquely identifying each machine's part and group of parts to be tracked.

Optionally, if no answer is received from the message broadcasted, the controller may categorize the machine or object detected as "non-cooperative". A set of descriptors uniquely identifying the object may be produced and stored. Operator assistance may be requested by the controller to identify the object or machine detected. If no additional information is obtained, the object or machine detected may be defined as "non-cooperative". Optionally, periodic retries for establishing communication may be initiated.

Optionally, when an "acknowledgement" is received from a machine in range, the initiating controller and the answering controller exchange data files on their physical appearance, configuration and moving parts (machine descriptors). This may include, but is not limited to, a depth map of the machine, a 3D model of the machine, color, actual size, identification of joints, specification of joints such as maximum speed and/or maximum payload, enabled dynamic changes in physical setup, type ID of the overall machine, type ID of each part, unique ID of the overall machine and unique ID of each parts, among others. The controller's software may have the code to perform this data exchange, interpret the data and store the results. Optionally, the basics for this software may be part of a "Controller Operating System". Optionally, this software may also be programmed and compiled with no dependency to a particular operating system, allowing it to run in multiple controller platforms.

Optionally, a set of motion detection tasks are associated to each machine's configuration being shared. These tasks may include a protocol where the identifying controller request from the identified controller to perform an action that would translate into a physical movement of parts and/or all of the machine parts, and the identifying controller may try to detect the resulting motion through depth map sensors and/or cameras.

Optionally, the identifying controller requests from the identified machine's controller to move a part or parts group while at the same time it tries to detect these movements through the depth map sensors and/or cameras.

Optionally, as the identified machine's controller generates the movement of parts or sets of parts defined in the identified protocol, the identifying controller may try to detect these movements through the depth map sensors and/or cameras. The movement detected through the depth map sensors and/or cameras may then be compared to the data of the actual movement request by the broadcasting controller and communicated back by the executing controller, and some adjustments may be performed if there is any discrepancy. This process may be performed several times until the discrepancy between the actual movement performed and the one detected through the depth map sensors and/or cameras are within tolerance. An adjustable threshold may be defined to allow configuring the maximum allowed discrepancy.

Optionally, once the previous steps are completed, the identifying controller may save all the adjusted descriptors of the machine and machine's parts detected on accessible storage. This data may be recalled and may be used each time another machine or machine parts of the type that was detected are found again in the range of the depth map sensors and/or cameras. This data may also be used whenever data sharing is requested between the identifying controller and the identified machine.

Optionally, in cases where the identifying controller does not manage to verify the performed movement by the identified machine or machine parts through the depth map sensors and/or cameras, the controller may ask for operators assistance. In the event that operators assistance is not received or is not sufficient to detect the movements of the machine through the depth map sensors and/or cameras, the identifying controller may register the identified machine as "non-traceable". This means that the controller may be able in the future to recognize the presence of the machine in the depth map sensors and/or cameras range, but may not be able to perform any tracking tasks on it.

Optionally, the ability to recognize and track the machine and the machine's movements may be measured by comparing the data obtained and processed from the depth map sensors and/or cameras versus the data generated by the machine's controller on the actual movement performed. Scores may be generated to characterize the "distance" between these two data sets. This may allow constant improvement in the ability to recognize and track the machine through the depth map sensors and/or cameras.

Optionally, during the machine's operations, usage data may be measured and stored. A fixed set of variables to measure may be pre-defined in an usage data collector. The data being measured may include, for example performance data, frequency of invocation, error frequency and severity, distance between x,y,z coordinates of given joints estimated by controlling machine versus x,y,z coordinates of joints detected by controllers' depth map sensors and/or cameras, among others. Usage data may also be collected on hardware components to favor them when possible in hardware improvement in the next design process. For example, accumulating how many times the machine was not able to grab an object due to its weight may help define a request for stronger mechanical arm and hand in the next replication process.

For example, given a navigation task, a machine may build an obstacles-free roadmap in a particular environment in order to satisfy future navigation requests. While the obstacles-free roadmap software is running, measures may be taken of the time it takes to build the roadmap and the number of iterations it uses. This last parameter may be useful when applying Monte Carlo type of algorithms where random points in space are selected and checked independently. The more iterations, the finer the resolution of the final roadmap.

Optionally, the machine's controller may use the built roadmap to satisfy a navigation request. For example, to move from point in space x1,y1,z1 to point x2,y2,z2. While navigating, it may register how many times it bumped against non-moving obstacles. The fewer obstacles the machine finds in its way, the better the roadmap-building algorithm worked for this environment.

Optionally, these coordinates may be calculated by the controller based on pulses of the machine's motors being controlled or other means. Comparing these coordinates with the ones detected by the controller's depth map sensors and/or cameras may enable the possibility of comparing efficacy between different modules in the depth map sensors and/or cameras' identification and detection.

Optionally, as the accumulated data grows, the machine's software may favor one implementation of the algorithm over the other in steps above.

Optionally, a machine's controller may share online or offline its own present and past accumulated usage data with other machines, creating this way a team-based improvement collaboration environment. It may also share physical layout, design, color, joints appearance, and configuration among others of the machine and machine's parts being controlled.

Optionally, a machine's controller may have access to others machines' controllers usage data as well as to the physical appearance of the machines being controlled, their 3D depth map representation, joints, color, configuration, etc. Parts of these data may be environmental-dependant, and therefore in these cases best outcomes are obtained when data is retrieved from machines that are running in similar environments.

Optionally, the methods of the presently disclosed subject matter may enable a machine controller to identify and track the machine parts that are being controlled by it, and those that are being controlled by other controllers. The process may include the detection of a machine in range, and the control either directly or indirectly of those machines, machines' parts and/or machines' controllers for performing a given task.

Optionally, controller may detect a machine or a machine controller in range, either through data broadcasting and acknowledgement or by detection through the depth map sensors and/or cameras.

Optionally, an operator may request to perform a given task that involves tracking machines and/or machines parts. A controller involved in this process may use the depth map sensors and/or cameras to track only the parts of the machine that is being controlled by it, or may use it to coordinate tasks between these parts and the ones of one or more machines and controllers in range that may participate in the execution of the task.

Optionally, a controller may detect changes in the environment that affect its performance during regular operations. Changes in environment may also threaten future operations of the machine and these situations trigger a new process that may look for updated data and algorithms for recognizing machines and machine's parts in similar new environments.

Optionally, the operator may initiate and identification and tracking process at any stage of the machine's operations and may stop any of these processes.

Optionally, a machine's controller might select other machines' controllers to contribute with (share its own usage data with them), or be contributed by (access their shared usage data), in the identification and tracking process.

Optionally, this selection may be based on a scan of the other machines' usage data, and an analysis of potential synergy of combining its own usage data with that of the other machines.

Optionally, this scan and selection may be performed locally or remotely using online or offline means that include but are not limited to: the Internet, LAN connections, WiFi, CAN, 3G, 4G, Wimax, Thunderbolt, cable-to-cable connections (LAN-to-LAN, Serial, Fiber cables, USB-to-USB, etc), flash disks, DVDs, CD-ROMs, etc. Alternatively, the selection of contributing machine(s) or machine(s) to contribute with may be done randomly.

Optionally, more than one machine may be identified and tracked in parallel in one process.

Optionally, a previous data sharing may occur, where the controller receives data descriptors characterizing the machine in question and its parts, as well as other information related to its configuration, physical layout, joints, colors, etc.

Optionally, a given robotic machine arm and hand may be configured with at least 9 degrees of freedom. For this example, each joint may be individually controlled by a motor and a modular driver. Each driver in each joint may be connected to the other through EtherCAN.

Optionally, the controller detects an identified object (potential machine) in the range of the depth map sensors and/or cameras and broadcasts a message to try to establish communication with the machine's controllers.

Optionally, these devices (together as a whole or individually) may return an acknowledgement message to the broadcasting controller.

Optionally, they may send to the broadcasting controller files and data characterizing their physical appearance, joints, colors, configurations, and usage data among other as specified earlier in this document.

Optionally, a mechanism may be activated by software both where a movement in robotic machine needing identification is generated and the controller tries to detect it on the depth map sensors and/or cameras.

For example, the broadcasting controller may request a movement of x degrees of joint C of finger 1, and may try to detect it from the depth map sensors and/or cameras. If it does not detect it, it may request an overall new position of the whole arm and may retry this operation.

Optionally, after several iterations the controller may have been able to detect several of the movements from the depth map sensors and/or cameras. It may also have created unique markers that may enable it to identify the machine parts (fingers, hand, etc) and any robotic machine design in the future. These markers are registered and might be shared with other controllers to facilitate future identification of robots.

Optionally, the robotic machine 2D and/or 3D image sequence input may come from one or more video cameras. In some cases this set may be embodied in a depth map sensors and/or digital cameras. These spatial sensors may be controlled by one or more higher speed computing nodes. In order to enable detection of distances and angles to objects, at least two cameras may be associated distributed to a robot. Depthmap sensors and/or cameras may be complemented with additional sensors such as light, ultrasound and laser sensors that may offer high precision of calculating distances to objects or to other robots.

Optionally, one or more computing devices may be dedicated to receiving real-time input streams from the depth map sensors and/or cameras, translating them into useful information that may be used in the robotic machine identification and tracking system, and other regular operations. Identification of robotic machine parts and coordination of hands for managing and performing coordinating tasks may be done with software that receives the output from these cameras and analyzes it. In some cases, depth map sensors, cameras and middleware software may be used to facilitate this process.

Optionally, one or more robotic machine fingers may have at least one pressure sensor or at least one array of pressure sensors. The instructions stored in the robotic machine specify maximum and minimum pressure readings to detect in each step. The pressure readings may be processed by yet a different computing device and translated into useful real-time information for the manufacturing process. Finger touch sensors may be complemented with "bumper" sensors distributed over the robotic machine body and extremities that may allow detecting collisions while navigating or while operating the arms and hands. These sensors may be controlled by the same computing device that controls the pressure sensors.

Optionally, the robot's parts are designed in a way that may allow the robotic machine easily identify them through the depth map sensors and/or cameras. For example, the parts may have fabricated markers incorporated, or other easily identifiable characteristics.

Robot parts design may be critical to enable the identification and tracking process later on. Design features may include for example, maximum weight per piece, maximum size per piece, color, shape and joint size, among others. Optionally, this design may facilitate the identification and tracking of the parts from the depth map sensors and/or cameras by a given robotic machine controller. For example, special screws may be one option for facilitating depth map sensors and/or cameras identification. These screws may have pentagonal heads and outstanding colors (usually red) on top of them that may facilitate their identification, tracking and manipulation.

Optionally, sharing usage data between two or more machines may be conducted through one or more of the following means: the Internet, LAN, WiFi, CAN, G3, G4, Wimax, Thunderbolt, one-to-one cables (serial, USB-to-USB, fiber optic, etc), USB disks, DVDs, CD-Roms, etc.

Optionally, a robot's controller may be able to identify the robot's parts and joints and track them as they move using a depth map sensors and/or cameras. The robot's controller may also be able to identify and track robots and robots' parts that are not being controlled by it, and coordinate actions with these based on depth map sensor and camera images.

Optionally, the controller or the operator may request the robotic machine parts depth maps, colors, layouts and other characteristics from a robotic machine supplier through the Internet or through other electronic means. The parts for which the request was made may be exactly the same ones that are being controlled by the leading robot's controllers and/or contributing robots' controllers, or improved ones.

Optionally, s large sheet of paper with color guidelines may be placed on the surface of the table in front of each robotic machine to identify to assist the controller in identifying each robotic machine and/or robotic machine part and tracking their sizes and locations.

Optionally, every step described herein may have a quality assurance stage where the controller verifies that the identification and tracking was accomplished successfully. This quality assurance stage may be either based on visual input of the assembled parts or on a combination of manipulation tests, visual sensors checks and pressure sensors checks.

Optionally, the controller may assign a unique ID to parts or part groups that have no identifiable IDs.

Optionally, the controller may communicate with other controllers in range and requests assistance. It may then retrieve datasets related to identification and tracking for the parts that are unidentified.

Optionally, the identification and tracking process is just a complement to the actual action that the robotic machine or set of robots are intended to perform. For example, picking up a piece and assembling it together (one or more robots in collaboration), palletizing boxes, arc welding, etc. The identification and tracking process may enable detecting the position of machines and machines' parts with respect to each other and with respect to other elements in the environment (i.e. the object being handled). This may enable the possibility of adapting the action being performed to a constant change in relative distances between machines and between physical elements in the environment and these machines.

Optionally, robotic machine software and hardware failures, including those related to identifying and tracking other robots' in range, may potentially create security risks to the robot, other robots, property and even human operators. Handling software and hardware errors, therefore, may be of great importance during the identification, improvement and regular tracking and identification operations.

Errors may be handled, for example, by the robotic machine software and categorized by severity. Most severe errors may be those where moving parts stop responding to control commands. In this situation, a special low-level software module may be invoked which turns off power to the devices or parts that are not responding. This ability to turn off electricity flow towards every moving part is intrinsic to every robotic machine version.

Optionally, in extreme situations where multiple errors are detected, the software module may turn off the entire robot.

Optionally, the robotic machine has a quality assurance module that may be invoked periodically to check through the robotic machine sensors that each moving device is responding correctly to the software commands that are being sent towards them and that each sensor is working appropriately. Any misbehavior or error produced in this stage may trigger a power off action. When these situations are encountered, operator's intervention may be required to turn the device back on and test it.

Optionally, considering that even the error detecting modules may fail, several switches may be placed on the back of the robotic machine that may allow the operator to: Turn off/on the whole robotic machine; Turn off/on a specific robotic machine moving part; Turn off/on each robotic machine hand independently; or, Turn off/on the wheels or robotic machine legs.

Optionally, these switches may be located in a specific part in the upper back of the robot.

Optionally, information may be displayed or voiced (depending on the robotic machine version) to the operators on the error, error type and severity.

Optionally, robotic machine may move either with wheels or robotic machine legs.

Optionally, the number and size of wheels may depend on the environment where the robotic machine may operate. A domestic robotic machine version, for example, may have two to four wheels.

Optionally, the size and number of legs may depend on the environment where the robotic machine may operate.

Optionally, wheels may be included but the robotic machine has no ability to control them. Instead, means may be given to an operator to control the robotic machine displacement from a joystick, a remote computer or through physical manipulation.

Optionally, robots may be programmed to perform a maximum number of operations per actuator and to last for a specific pre-established maximum number of months. Thirty months may be the default number of months that a robotic machine may operate, even though this number varies depending on the robots past performance.

Optionally, robotic machine software may be programmed to stop all robotic machine operations after this threshold is reached. Robots may be recyclable and may be sent back to the supplier once it ceases operations. Alternatively, its parts may be dismantled and may be used by other robots in the future.

Optionally, a robotic machine center point, defined as a point in space with coordinates 0,0,0 (x,y,z) may be established for position calculation purposes. The robotic machine software may estimate the positions of every robotic machine part with regards to this center point, as well as the positions of any other robotic machine and object in the environment, distances, etc. Based on this point, the robotic machine may know the relative position of every robotic machine part with regards to each other and the environment. The robotic machine center point may be useful for any distance and location calculation that the robotic machine performs, as well as for estimating position of the robotic machine and its components in space. The depth map sensors and/or cameras output may be analyzed and all machine parts and objects positions identified in the environment may be estimated as a relative coordinate with respect to this Robot Center Point.

Optionally, in addition to other security measures to avoid unauthorized access, all software and usage data may be stored using advance encryption algorithms. Communication between computing nodes, sensors, actuators, overall machines, servers and/or storage devices may also be encrypted and may include the unique ID of the devices involved in the communication.

Optionally, human intervention may be possible in any of the processes described herein. This intervention may include, but is not limited to, adding tasks, adding or editing machine and machine parts descriptors, editing and maintaining tasks, deleting tasks, interrupting any given task, scheduling new tasks, initiating a identification and tracking process, adding new usage data, turning off temporarily or permanently a robotic machine or set of robots, etc. A strong access security schema may be embedded in the machine's software to enable or disable specific users to perform one or more of the interventions described above.

Optionally, one or more implementations of logic units may be included in every base-machine's controller. "Logic units" as used herein, may be the granular elements of a hierarchical breakdown of the machine's overall descriptors, software, firmware and hardware functionality. Each "logic unit" may define a set of specifications for a software, hardware, and/or firmware implementation of this unit. These specifications include, but are not limited to, the unit's function, input/output parameters, unique identification, etc.

Optionally, each "logic unit" may be implemented one or more times, each implementation being a different coding, algorithmic approach or hardware variant that achieves the same overall function defined by the "logic unit".

Optionally, "Logic units" corresponding to software may be referred to herein as "software units", while each software implementation of a given "logic unit" may be referred to herein as "software unit replica" or just "replica". For any given "software unit", one or more "replicas" may be available to the machine. The same may be applied to machines' and machines' parts descriptors. More than one dataset of descriptors may exist of the same machine or machine parts. Each of copy of this dataset may be called "descriptor replica" or replica. The descriptors may be used alternately for identifying the given machine or machine parts, eventually favoring those that produced more accurate identification and tracking results.

According to some embodiments of the present invention, there are provided a method and device for constant improvement in machine's controller selection of software unit replicas.

Optionally, usage data may be collected for each task performance and used to decide which descriptors and software replica to use in future tasks. Improvement may also be obtained by allowing the controller to define modifications and/or improvements to machine's parts and parts set descriptors for future identification and tracking purposes.

Optionally, a collaborative environment may be created to enhance identification and tracking abilities by sharing parts descriptors, software units and/or usage data between machines' controllers and allowing them to select the ones to use based on accumulated usage data on all or part of the participating machines' controllers.

Optionally, one or more processing units connected to a spatial sensor, a data collector unit and a selector unit. The data collector unit may be configured to obtain the machine's layout descriptors data and usage data in respect of at least one logic unit and at least one replica of a logic unit. The selector unit may be configured to select from at least one set of descriptors, at least one logic unit and at least one replica.

Optionally, the machine's controller may have the ability to improve its identification and tracking abilities during regular operations by selecting best performance software replicas to invoke.

Optionally, execution of movements by the controller and comparison with the identifying instructions sent may be implemented in software. In this example this software hierarchical breakdown could be: Motion Planning and Execution; Obstacle-Free Roadmap Discovery; RRT Algorithm; Nearest Neighbor Algorithm; Detect Shortest Path; Search Forward Algorithm; and, Perform Motion. Optionally, each element of this functionality breakdown may be considered as a "logic unit". One "logic unit" may group more granular "logic units". For example, Obstacle-Free Roadmap Discovery may group RRT algorithm functionality and Nearest Neighbor algorithm functionality.

According to some embodiments of the present invention, there are provided a method and device for self-improving and team-improving is proposed where a machine's controller invokes alternately different replicas of given software units for identifying and tracking controlled and not-controlled machines and machines' parts in the spatial sensor's device range, and collects usage data on them. Each time a new software unit may be requested for execution, these collected data may be evaluated and a decision may be made on which software unit replica to invoke and which descriptors replica to use. Eventually, software unit replicas and descriptor replicas with higher past performance scores may be favored. The same principle applies to firmware and hardware logic units.

Optionally, the controller may alternately invoke different replicas of the software units and use alternative replicas of the machines descriptors needed during operation. These replicas include the ones available locally to the machine and the ones that have been shared online or offline by other machines, by servers or by any accessible data storage devices to assist the identifying and tracking process. Shared replicas may also be transferred directly to the machine by other machines, servers or operators and made available to it locally.

Optionally, a set of variables characterizing a machine's operation and performance may be collected and stored. The data may include the level of accuracy obtained by comparing the calculated data of any physical movement performed in the task vs. the estimated data of this movements based on images and depth maps captured dynamically with a spatial sensor device.

For example, a request to create an obstacles-free roadmap for future navigation in an environment may be implemented three or more times in the machine's software. Each time the machine invokes the roadmap-building software units, a decision may be made on which implementation or replica of these units may actually be invoked. Accumulated usage data on each replica available to the machine may be used to decide which replica to favor over the other. The machine's controller may later on invoke software units for navigation that may use the roadmap as an input to decide on an optimized path between an origin point in space and a destination point. These software units may also have replicas and again may be invoked alternately, eventually favoring one over others depending on the usage data collected on each of them.

Optionally, the ability to recognize and track the machine and the machine's movements may be measured by comparing the data obtained and processed from the spatial sensor device vs. the data generated by the machine's controller on the actual movement performed. Scores may be generated to characterize the "distance" between these two data sets. This may allow constant collaborative improvement in the ability to recognize and track the machine through the spatial sensor device.

Optionally, collaborative improvement may also be obtained by sharing usage data and/or software units and replicas between two or more machines controllers.

Optionally, tasks may be initiated by operator requests, by other machines' controllers requests, by the operating system or by behavioral actions programmed into the machine. Tasks may also be triggered by other internal and/or environmental conditions. Tasks may be interrupted by other tasks based on priorities set by the operating system. For example, a task to move from point A to point B may be interrupted if another machine may be detected in range approximating the navigation path of original machine, either through the spatial sensor device or through the data being shared between machines.

Optionally, tasks may be performed by invoking one or more software units available to the machine. Each task may be break down into a set of calls to existing software units. These software units may be requested according to the sequential logics of the task being performed.

Optionally, previously collected usage data available to the machine may be analyzed and a score may be given to each replica according to its past performance. For example, a replica that ran faster than others in similar conditions in the past may be ranked higher than the ones that ran slower; a replica that had a higher rate of failures in the past may be ranked lower, and so on. A replica and dataset that had translated in closer results between the actual movement requested by the controller and the one detected by the spatial sensor device may have higher score, and so on. The analysis may add and use other machines' usage data for this analysis when these data may be shared or made available by those machines' controllers.

Optionally, a software replica to be invoked may be selected based on the usage data analysis performed. In certain occasions a dataset associated to this replica may also be selected based on past-performance data. The selection may include other machines' replicas for the given software unit when those machines share and make these replicas available.

Optionally, software replicas with higher scores may be favored against the ones with lower scores. However, in some cases, a software replica with low scores may be invoked in order to validate that its score remains consistently low and that the replica does not improve with new runs under new conditions. Replicas that constantly obtain low scores may be disregarded eventually in future selections.

Optionally, when only one single replica may be available to the machine's controller for a given software unit, that single replica may be the one included in the selection performed in this process.

Optionally, the machine invokes and runs the particular software replica selected.

Optionally, the controller may start favoring one implementation of the algorithm over the other.

Optionally, a machine's controller may share online or offline its own present and past accumulated usage data with other machines, creating this way a team-based improvement collaboration environment. It may also share physical layout, design, color, joints appearance, and configuration among others of the machine and machine's parts being controlled.

Optionally, a machine's controller may have access to others machines' controllers present and past usage data as well as to the physical appearance of the machines being controlled, their 3D depth map representation, joints, color, configuration, etc. Parts of these data may be environmental-dependant, and therefore in these cases best benefits may be obtained when data may be retrieved from machines that may be running in similar environments. For example, a machine that operates in a domestic environment such as a one-floor house with certain illumination characteristics may take best advantage of accumulated data on navigational software units of other machines running in one-floor houses with similar illumination, as opposed to running in heavy-equipped darker industrial environments.

Optionally, shared data may include information on current tasks being performed, either in collaboration with the accessing machine or not, which may allow the accessing machine to improve the performance of its own running tasks. For example, if a team of machines is going to lift a heavy object and move it across the room, the shared data may include distribution of roles, calculations of intended strength to use, direction, timing, etc., allowing coordination of work between the machines in order to perform the common task successfully. In other occasions, a remote machine that navigates through certain space before a second machine does, may share data on its location, calculations and findings to allow the second machine to take correct decisions about where and how to move in this space.

Optionally, a machine's controller may invoke software units and replicas that may not be locally stored on its own data-storing device. The machine may have online or offline access to others' machines software units and replicas, and invoke them as needed. These may include replicas of software units that may be common to both the accessing machine's controller and the sharing machine's controller, and/or software units (with their replicas) that may be only present in the sharing machine.

Optionally, a machine may decide to copy the remote software units and replicas locally before invoking them.

Optionally, a machine may share all or part of its own software units and replicas with other machines.

Optionally, sharing may include replicas of software units that may be common to both the sharing machine and accessing machine, and/or software units (and their replicas) that may be present only in the sharing machine.

Optionally, sharing of software units and replicas may be performed both online and offline. This ability may also be obtained using a server or any other device with accessible data storage that stores machines software units and replicas and shares them with other machines.

Optionally, three alternative roles may be defined for machines' controllers taking part in the identification and tracking process: Leading Machine; Contributing Machine; and, Assistant Machine.

Optionally, a leading Machine may be in charge of identifying and tracking other machines and/or other machines' controllers, coordinating the transfer of software units, replicas and/or usage data between the participating machines. The selection of data to transfer may include only software units, replicas and usage data belonging to the "leading machine", or may be extended to include the ones made available by other machines "contributing" with the identification and tracking process. It should be noted that for the purpose of defining the tracking and identification process, a difference may be made between "collaborating" in the process and "contributing" with the process. Collaborating means assuming computing tasks related to the identification and tracking of machines and machines' parts involved in the process, while contributing means sharing own software units, replicas and/or usage data. The leading machine may be in charge of tracking the machines parts movements and coordinating the sharing of these data between the participating machines and controllers. Finally, the leading machine may also coordinate messages and work between all of the machines and controllers collaborating with a given task, informing them what tasks to perform and verifying the correct completion of those tasks as well as transmitting part or all of the identification and tracking information. The leading machine's controllers may perform all these tasks, or may distribute part or all of them among controller "assistants" when such controllers may be available in the process.

Optionally, a Contributing Machine shares its own software units, replicas and usage data with a "leading machine", in order to enable this last one to select parts or all of these components, and use it in the identification and tracking of machines' involved in the process. Contributed usage data may also be used by the "leading machine" to define changes or enhancements to algorithms involved in identifying and tracking the machines' parts. The process may take place without the participation of "contributing machines", as in some cases one "leading machine" may use only its own software units, replicas and usage data, and perform all the computations and analysis required in this process. Therefore, contributing machines may be optional to the machine and machine's parts identification and tracking process.

Optionally, an Assistant Machine may collaborate in performing the task and in identifying and tracking machines involved in this task by following instructions of the "leading machine" and by coordinating work with other assistant machines. Additionally, a collaborating machine may perform analysis and/or other computational tasks assigned to it by the leading machine during the identification and tracking process. The identification and tracking process may take place without the participation of assistants, as in some cases the "leading machine" may perform all the tasks and perform all the computations and analysis required in this process by itself. Therefore Assistants may be also optional to the machine identification and tracking process.

Optionally, controllers participating in the identification and tracking process may alternate roles as the process progresses. This means that a machine's controller that starts the process as a "leader machine" may later on, during the same process, transfer this role to a different machine and, for example, assume the role of "assistant". Equally, an "assistant" may cease assuming this role and then, during the same process, assume the role of "contributing machine", and so on. This role alternation may be based on each controllers abilities and their potential performance in a given role during each stage.

Optionally, detection of a machine or a machine controller may trigger the Machine Identification and Tracking process, either through data broadcasting and acknowledgement or by detection through the spatial sensor device.

Optionally, an operator request to perform a given task that involves tracking machines and/or machines parts may trigger the Machine Identification and Tracking process. A controller involved in this process may use the spatial sensor device to track only the parts of the machine that may be controlled by it, or may use it to coordinate tasks between these parts and the ones of one or more machines and controllers in range that may participate in the execution of the task.

Optionally, detecting one or more collaborating machines whose shared software and/or data may have contributed successfully to own operations in the past may trigger the Machine Identification and Tracking process.

Optionally, a controller may detect changes in the environment that affect its performance during regular operations and may trigger the Machine Identification and Tracking process. Changes in environment may also threaten future operations of the machine and these situations trigger a new process that may look for updated data and algorithms for recognizing machines and machine's parts in similar new environment.

Optionally, the operator may initiate an identification and tracking process by demand at any stage of the machine operations and may stop any of these processes.

Optionally, a machine's controller may select other machines' controllers to contribute with (share its own software units, replicas and usage data with them), or be contributed by (access their shared software units, replicas and usage data), in the identification and tracking process. This selection may be based on a scan of the other machines' software and usage data, and an analysis of potential synergy of combining its own software units, replicas and usage data with that of the other machines. This scan and selection may be performed locally or remotely using online or offline means that include, but are not limited to: the Internet, LAN connections, WiFi, CAN, 3G, 4G, Wimax, Thunderbolt, cable-to-cable connections (LAN-to-LAN, Serial, Fiber cables, USB-to-USB, etc), flash disks, DVDs, CD-ROMs, etc.

Optionally, the selection of contributing machine(s) or machine(s) to contribute with may be done randomly.

Optionally, identification and tracking assistants may be selected by physical proximity and/or by analysis of their past performance in related tasks.

Optionally, assistant(s) may be selected randomly. An assistant machine may not necessarily need to be in the proximity of the leading machine in order to be selected. The assistant machine may assist in the identification and tracking of a given machine or parts remotely by receiving a set of depth maps, layout and images of the parts and sending them already pre-processed to the leading machine.

Optionally, more than one machine may be identified and tracked in parallel.

Optionally, the processes performed in the Machine Identification And Tracking stage may include any one of the steps of: Share Software and Usage Data; Retrieve Remote Software and Usage Data; Analyze Usage Data; Select Software Units, Replicas and Usage Data to Use; Upgrade Machines and Machines' parts descriptors; and, Use Selected Software Units, Replicas, Descriptors Replicas and Usage Data.

Optionally, the robot's software and parts data may be designed to allow their transfer to other robot controllers and to allow improvement.

Optionally, the term machine within the meaning of the presently disclosed subject matter may not be limited to a robot and may include any machine with appropriated processing capabilities. For example, in some cases the machine described in this document may be a two axis cleaning robot. On other cases it may be a regular computer or a server that benefits from the self-improvement mechanism described in this invention. The computer's software may be replicas, as described herein, and the accumulation of usage data that may later on be used to select the best replicas to invoke. A computer may also assume the "leading machine" role of an identification process, even if it requires "assistant machines" to perform the actual work. Or, it may fully perform a "logical" identification and tracking process, where it identify and track other machines based on the spatial sensor device output by selecting—based on usage data—, software units and replicas available to it, even if this computer is not performing any control type task. Finally, a computer may fully assume the role of "contributing machine", by sharing its own software units, replicas, descriptors and usage data with other computers and/or machines.

Optionally, another example may include Internet website servers running software collaboratively and sharing "software units" and "replicas" on their regular operations. Then a website software running on one of the servers could eventually identify and track a new website, passing on a set of "software units", replicas, descriptors and usage data as described herein.

As used herein, the phrase "for example," "such as", "for instance" and variants thereof describe non-limiting embodiments of the presently disclosed subject matter. Reference in the specification to "one case", "some cases", "other cases" or variants thereof means that a particular feature, structure or characteristic described in connection with the embodiment(s) is included in at least one embodiment of the presently disclosed subject matter. Thus the appearance of the phrase "one case", "some cases", "other cases" or variants thereof does not necessarily refer to the same embodiment(s).

It is appreciated that certain features of the presently disclosed subject matter, which are, for clarity, described in the context of separate embodiments, may also be provided in combination in a single embodiment. Conversely, various features of the presently disclosed subject matter, which are, for brevity, described in the context of a single embodiment, may also be provided separately or in any suitable subcombination.

In other embodiments of the presently disclosed subject matter, fewer, more and/or different stages than those shown in FIG. 3, FIG. 4, and FIG. 5 may be executed. In embodiments of the presently disclosed subject matter one or more stages illustrated in FIG. 3, FIG. 4, and FIG. 5 may be executed in a different order and/or one or more groups of stages may be executed simultaneously.

What is claimed is:

1. A method for defining a robotic machine task, comprising:

using at least one processor to execute code instructions for:

collecting a sequence of a plurality of images captured by at least one sensor showing at least one demonstrator performing a task and operating in a work environment of said performed task, wherein said task comprises at least one manipulation of at least one object;

performing an analysis of said sequence of a plurality of images to identify demonstrator body parts manipulating said at least one object and to identify changes to said at least one object by said at least one manipulation, wherein said changes to said at least one object are at least one of changes of relative positions, changes of orientations, changes of assembly, changes of content and changes of shape;

determining according to said analysis at least one robotic machine movement to perform said task;

calculating a modified task based on said task, by applying at least one time dimension transformation on said at least one robotic machine movement, said at least one time dimension transformation is a member of a group consisting of accelerated pace of said at least one robotic machine movement, decelerated pace of said at least one robotic machine movement and performing said at least one robotic machine movement in reversed manner; and generating at least one motion command for instructing said robotic machine to perform said modified task.

2. The method of claim 1, wherein said sequence of a plurality of images is captured by at least one depth map sensor.

3. The method of claim 1, wherein said sequence of a plurality of images is captured by at least one digital camera.

4. The method of claim 1, wherein said modified task is further calculated by applying at least one space dimension transformation on said at least one robotic machine movement, said at least one space dimension transformation is a member of a group consisting of scaling of an extent of said at least one robotic machine movement and rotation of a direction of said at least one robotic machine movement.

5. The method of claim 1, wherein said motion commands are adjusted to take into account robotic machine capabilities of different types, makes, and models, by processing said at least one robotic machine movement to be within said robotic machine capabilities.

6. The method of claim 1, wherein said demonstrator is one of at least one of a human, an animal and a machine.

7. A method for communications between a controller associated with a robotic machine and at least one controller associated with at least one other robotic machine comprising:

using at least one processor included in a controller associated with a robotic machine to execute code instructions for:

receiving at least one sequence of a plurality of images captured by at least one sensor associated with said robotic machine, said at least one sequence of a plurality of images depicts one other robotic machine performing at least one gesture by moving at least one robotic machine part of said one other robotic machine;

performing an analysis of said sequence of a plurality of images to identify said at least one gesture, by comparing said sequence of a plurality of images to a plurality of images of previously demonstrated plurality of gestures;

identifying at least one command associated with said at least one gesture, wherein said at least one command is for executing a pre-defined task which is different than said at least one gesture; and instructing said robotic machine to execute said pre-defined task.

8. The method of claim 7, wherein said at least one sequence of a plurality of images is captured by at least one depth map sensor.

9. The method of claim 7, wherein said at least one sequence of a plurality of images is captured by at least one digital camera.

10. The method of claim 7, wherein said at least one command comprises associating a subset of the identified at least one robotic machine part movement with another at least one command.

11. The method of claim 7, wherein said at least one command to be executed by said robotic machine is for assigning at least one message from said robotic machine to a human operator, by movement of at least one robotic machine part, of said robotic machine to mimic intuitively understood human body language.

12. The method of claim 1, wherein said at least one processor is further used to execute code instructions for recording a plurality of three dimensional positions in space associated with said demonstrator body parts manipulating said at least one object and with said changes to said at least one object; and selecting a type of movement path between said plurality of three dimensional positions in space for said at least one robotic machine movement, wherein said type of movement path is at least one of a straight line, a circle and an ellipse and wherein said selecting is done either automatically or by operator guidance.

13. The method of claim 1 wherein said at least one processor is further used to execute code instructions for identifying a first gesture performed by said at least one demonstrator, wherein said first gesture signals a command to start a learning mode.

14. The method of claim 13 wherein said at least one processor is further used to execute code instructions for identifying a second gesture performed by said at least one demonstrator, wherein said second gesture signals a command to stop said learning mode.

\* \* \* \* \*